(12) United States Patent
Ostrovskii et al.

(10) Patent No.: US 8,344,588 B2
(45) Date of Patent: Jan. 1, 2013

(54) MULTIDOMAIN ACOUSTIC WAVE DEVICES

(75) Inventors: Igor Ostrovskii, Oxford, MS (US); Andriy Nadtochiy, Oxford, MS (US)

(73) Assignee: University of Mississippi, University, MS (US)

(*) Notice: Subject to any disclaimer, the term of this patent is extended or adjusted under 35 U.S.C. 154(b) by 339 days.

(21) Appl. No.: 12/440,632

(22) PCT Filed: Sep. 11, 2007
(Under 37 CFR 1.47)

(86) PCT No.: PCT/US2007/078168
§ 371 (c)(1),
(2), (4) Date: Aug. 11, 2010

(87) PCT Pub. No.: WO2008/033844
PCT Pub. Date: Mar. 20, 2008

(65) Prior Publication Data
US 2011/0006638 A1    Jan. 13, 2011

Related U.S. Application Data

(60) Provisional application No. 60/825,194, filed on Sep. 11, 2006.

(51) Int. Cl.
*H01L 41/08* (2006.01)

(52) U.S. Cl. .................... 310/311; 310/313 R; 310/357; 310/358

(58) Field of Classification Search .......... 310/357–359, 310/313 A, 313 R
See application file for complete search history.

(56) References Cited

U.S. PATENT DOCUMENTS

| | | | | |
|---|---|---|---|---|
| 2,875,355 A | * | 2/1959 | Petermann | 310/334 |
| 3,840,826 A | * | 10/1974 | Toda et al. | 333/144 |
| 3,918,012 A | | 11/1975 | Peuzin | |
| 4,109,359 A | * | 8/1978 | Cross et al. | 29/25.35 |
| 4,129,799 A | * | 12/1978 | Green | 310/359 |
| 4,381,469 A | * | 4/1983 | Ogawa et al. | 310/313 R |
| 4,403,834 A | * | 9/1983 | Kley | 359/305 |
| 4,464,639 A | | 8/1984 | Staples | |
| 5,350,961 A | * | 9/1994 | Chu | 310/313 A |
| 5,360,007 A | | 11/1994 | Shinomura | |

(Continued)

OTHER PUBLICATIONS

Ostrovskii, A. B. Nadtochiy, Domain Resource in Two-Dimensional Periodically Poled Ferroelectric Resonator, Applied Physics Letters, 86, 222902, (2005).

(Continued)

*Primary Examiner* — Mark Budd
(74) *Attorney, Agent, or Firm* — Stites & Harbison PLLC; Richard S. Myers, Jr.

(57) ABSTRACT

A multidomain plate acoustic wave device is provided having one or more single piezoelectric crystalline plates with differently polarized ferroelectric domains, where the domains have diverse directions of their axes of polarization. The device may consist of a multidomain plate acoustic wave transducer, a multidomain plate acoustic wave delay line, a multidomain plate acoustic wave rf filter, and any combination thereof. The differently polarized ferroelectric domains may comprise a collection of inversely or differently poled ferroelectric domains within a single piezoelectric medium. The medium may be any crystalline or ceramic plate with non-zero piezoelectric properties, in which the domains are created and embedded. In varying embodiments, the device includes electrodes oriented to generate an external rf field in various, respective directions, including in a direction normal to a basal plane of the device, or in a direction parallel to a length or a width of the device.

18 Claims, 16 Drawing Sheets

U.S. PATENT DOCUMENTS

| | | | |
|---|---|---|---|
| 5,732,177 | A | 3/1998 | Deacon et al. |
| 5,756,263 | A * | 5/1998 | Gupta et al. ............... 430/317 |
| 2002/0135270 | A1 | 9/2002 | Ballandras |
| 2004/0101990 | A1 * | 5/2004 | Dunn et al. ................. 438/48 |
| 2011/0006638 | A1 * | 1/2011 | Ostrovskii et al. ............ 310/320 |

OTHER PUBLICATIONS

Ostrovskii, A. B. Nadtochiy, Free Vibration of Periodically Poled Ferroelectric Plate, Journal of Applied Physics, vol. 99, p. 114106 (2006).

Ostrovskii, A. B. Nadtochiy, Acousto-electric Characteristics of Periodically Poled Ferroelectric Plate, Condensed Matter, 0503/0503222 (2005).

Campbell, Colin K., "Understanding Surface Acoustic Wave (SAW) Devices for Mobile and Wireless Applications and Design Techniques," (2004).

Odagawa, et al., SAW devices beyond 5 GHz., International Jour. High Speed Electronics and Systems, V. 10, N. 4, 111-1142 (2000).

Lehtonen et al., "Surface acoustic wave impedance element filters for 5 GHz.", Applied Phys. Letters, V. 75, N. 1. p. 142-144 (1999).

Nadtochiy, et al., Ferroelectric bimorph cantilever with self-assembled silane layer, Applied Phys. Letters, V. 92 263503 (2008).

Ostrovskii, et al., Multidomain Ultrasounic Transducers, Jour. of Applied Phys. V. 103, 104107 (2008).

Ostrovskii, et al., Plate wave stop-bands in periodically poled lithium niobate, JASA, V. 125 (4) Apr. 2009.

* cited by examiner

PRIOR ART

PRIOR ART

MULTIDOMAIN ACOUSTIC WAVE DEVICES

CROSS-REFERENCE TO RELATED APPLICATION

This application claims priority to U.S. provisional patent application Ser. No. 60/825,194, filed Sep. 11, 2006, herein incorporated by reference.

FIELD OF THE INVENTION

The present invention relates to acoustic wave devices including ultrasonic transducers and their usage in the delay lines and rf filters and, more specifically, to very high frequency ultrasonic transducers and devices employing acousto-electric interactions.

BACKGROUND OF THE INVENTION

The fabrication of periodic inversely poled structures in bulk ferroelectrics was first developed over two decades ago. Since then, some main areas of research include the fabrication of inversely poled micro-domains in bulk ferroelectric crystals, and their possible applications for bulk acoustic wave ultrasonic transducers. Different bulk ferroelectric crystals ($LiNbO_3$, $LiTaO_3$, $KTiOPO_4$, and $BaTiO_3$) with one-dimensional periodic domain structures have been reported in a bulk media, but without specific applications for the acoustic devices, and without the embodiments of possible devices. The domain walls and associated complexes of crystal lattice defects also have been reported to be responsible for a new type of nonlinear ultrasonic attenuation in lithium niobate.

Recently, a domain resonance in two-dimensional periodically poled ferroelectric plates has been reported in Ostrovskii, A. B. Nadtochiy, *Applied Physics Letters*, 86, 222902, (2005) (hereinafter "Ostrovskii 2005 (1)"). In one prior art free periodically poled ferroelectric vibrator disclosed in Ostrovskii 2005 (1) and I. V. Ostrovskii, A. B. Nadtochiy, Free Vibration of Periodically Poled Ferroelectric Plate, *Journal of Applied Physics*, Vol. 99, p. 114106 (2006) (hereinafter "Ostrovskii 2006"), and shown in FIG. 1, the periodically poled multidomain free vibrator of the length L=2dN and thickness 2t consists of the differently polarized regions denoted as A1 and B1 named inversely polled ferroelectric domains. They have opposite directions of their axes of polarization shown as +z and −z. Mathematically this configuration is represented by opposite signs of piezoelectric coefficients e in the adjacent domains, that is +e for A-type domains and −e for B-type domains. This reflects a fact that the same type of mechanical strain generates opposite piezoelectric fields in A- and B-domains. The crystallographic reference frame is shown by the z- and y-axes that represent a piezoelectric plate of a standard ZY-cut chip. It has been shown that rf-admittance demonstrated a resonance-antiresonance behavior as disclosed in Ostrovskii 2005 (1); and I. V. Ostrovskii, A. B. Nadtochiy, Acousto-electric Characteristics of Periodically Poled Ferroelectric Plate, *Condensed Matter*, 0503/0503222 (2005) (hereinafter "Ostrovskii 2005 (2)"); and amplitude of free vibrations had maximum at certain frequency as taught by Ostrovskii 2006.

Ferroelectric chips are widely used for the fabrication of ultrasonic transducers and surface acoustic wave (SAW) devices for applications in ultrasonics, medicine, telecommunication, etc.

U.S. Pat. No. 4,464,639 discloses an interdigital transducer for Surface Acoustic Wave (SAW) excitation. In this patent and in U.S. Pat. No. 5,350,961, the inversely poled domains are mentioned in the sense that tiny interdigital electrodes are used to generate the SAW. This transducer must have the metal electrodes more thinly than an acoustic half-wavelength.

This requirement yields a technological restriction on upper limiting frequency since photolithographic technology can not make a very thin and still reliable electrodes needed for very high frequencies in the gigahertz frequency range. A problem is the metal interdigital electrodes must be too narrow (about 210 nm) for lithographic process and, in addition, these narrow metal electrodes are not stable over time as shown by Colin K. Campbell, "Understanding Surface Acoustic Wave (SAW) Devices for Mobile and Wireless Applications and Design Techniques," (2004) (hereinafter "Campbell"). Another limiting issue is the nature of the surface acoustic waves propagating along crystal surface. In the case of very high frequencies of the gigahertz frequency range, a quality of mechanical polishing of a crystal surface becomes unsatisfactory, and high SAW attenuation does not permit one to fabricate a delay line. Industrial-scale SAW-device production based on optical lithography is feasible up to 2.5 GHz ($2.5 \times 10^9$ Hz) (as shown by Hiroyuki Odagawa, and Kazuhiko Yamanouchi, SAW devices beyond 5 GHz., *International Jour. High Speed Electronics and Systems*, V. 10, N. 4, 111-1142 (2000) (hereinafter "Odagawa et al.")), which is consistent with present global UMTS standard for 2 GHz communication in S-band of Super High Frequency (SHF). Due to commercial and security applications, it is anticipated that there will be an increase in operation frequency and subsequent shift to the range of 2 to 10 GHz range as shown by Campbell; Odagawa and S. Lethonen et al., "Surface acoustic wave impedance element filters for 5 GHz.", *Applied Phys. Letters*, V. 75, N. 1. p. 142-144 (1999). Unfortunately, there is no current technology for very high frequency acousto-electric devices.

With regard to prior periodically poled ultrasonic transducers, the prior transducers consist of an array of inversely poled small single ceramic transducers that are brought together in one composite embodiment. FIGS. 2a and 2b show two ultrasound transducers disclosed in U.S. Pat. No. 5,360,007. In FIG. 2a, the transducers 12 are arranged to have alternately reverse directions of polarizations, and filling members 13 are provided between the transducers 12 so to prevent their lateral coupling. The electrodes 14, 15 are provided, and acoustic matching layers 16, 17 are formed on the ultrasonic wave transmission surface. A substrate 18 is necessary to hold this composite transducer. In FIG. 2b, the device has sectional electrode 14. In both cases, there is no acoustical coupling between the single piezoelectric elements 12 with inverse polarization. Substrate 18 is essential, and bulk acoustic waves are irradiated in the direction of polarization of the elements 12. Similar devices for composite ultrasonic transducers are often referred to as "ultrasonic transducer arrays" in the art.

High frequency or wide band ultrasonic transducers directed for use as bulk acoustic waves, consist of a thin piezoelectric film deposited on a substrate. For example, FIG. 3 depicts a multidomain surface acoustic wave transducer disclosed in Patent Application Publication No. US 2002/0135270. Unfortunately, the reference fails to teach or provide an enabling disclosure to allow one to make a multidomain surface acoustic wave transducer. The reference merely presents a theoretical idea about a multidomain film transducer consisting of the inversely poled domains D1 and D2, which are deposited on one or more substrates. Further, this reference does not describe an actual example of a device which could function in a manner speculated in the reference.

Therefore, one skilled in the art cannot create such a surface acoustic wave transducer, as one would not know how to construct one.

All of the aforementioned devices and references relate to bulk or surface acoustic waves that are generated by some composite transducer. The current state-of-the-art in high frequency and buffer free ultrasonic composite transducers are limited by about 35 MHz. For example, for bulk acoustic waves, a film transducer consists of a very thin piezoelectric film deposited on a solid buffer. These transducers may be fabricated up to 1 GHz frequency, but it is actually a massive delay line; and, therefore, its size cannot be miniaturized at all. No prior device is able to be incorporated into a wide band ultrasonic transducer or ultrasonic chirp device.

There is a need in the art for new micro/nano technology designed for higher frequency acoustic devices, especially those designed for planar technology.

SUMMARY OF THE INVENTION

A principal object of the present invention is to provide a multidomain acoustic and ultrasonic device, such as an acoustic ultrasonic transducer, an ultrasonic delay line, and an rf filter, employing a set of inversely poled ferroelectric domains that are fabricated within a single block of piezoelectric material. Such multidomain ultrasonic devices are achievable through the provision of specifically designed inversely poled ferroelectric domains fabricated and embedded within one crystal body, in which a transformation from electrical energy to acoustic wave/vibrational energy takes place. For example, A/C current can be applied to the set of inversely poled ferroelectric domains, and the domains will vibrate with matching phase providing an acousto-electric resonance at the frequencies that depend on the domain dimensions. In such a device, acoustic contact between the ferroelectric domains is essential to provide a desired acoustic wave.

Further, a multidomain ultrasonic transducer according to one form of the invention additionally exhibits an ability of operation at very high frequencies up to the terahertz frequency range, and provides an enhanced degree of miniaturization since the ferroelectric domains may be fabricated with the dimensions in the nanoscale range. An advantage of this device is provided by a high frequency of operation which permits imaging of micro scale objects.

According to one aspect of the invention, a wide band or chirp multidomain ultrasonic transducer can operate in the high frequency range with variable frequencies that are suitable for applications in measuring of thin film or coating thickness, and visualization of micro scale objects.

The usage of two or more multidomain plate acoustic wave transducers permits one to design and fabricate an ultrasonic delay line operating at very high frequencies up to the terahertz frequency range.

A multidomain rf filter with operation frequency up to the terahertz frequency range can be fabricated in accordance with the present invention. Lower frequency ranges including megahertz and kilohertz bands are achievable as well by fabricating more wide ferroelectric domains with an appropriate ratio of acoustic wavelength and domain width, as the domain resonance occur when the domain width is equal to a half wavelength of the acoustic wave.

BRIEF DESCRIPTION OF THE DRAWINGS

FIG. 24 is a frequency dependence of rf impedance measured from the multidomain plate transducer LTYR42B5a.

FIG. 26a is a microphotograph of a multidomain plate transducer in LiTaO$_3$ sample LTZ-A9-P22, in accordance with the present invention; and FIG. 26b is a schematic showing the area which is represented in the microphotograph in FIG. 26a.

DETAILED DESCRIPTION

Figure 6:
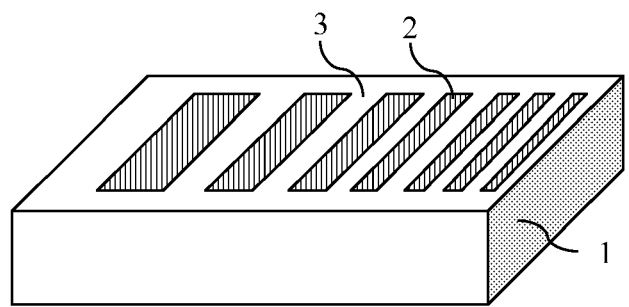
FIG. 6 is a diagram showing a single piezoelectric crystal in which inversely poled ferroelectric domains are implanted.

In the description to follow, like reference numbers are used to identify like elements. Referring now to the figures, a wide band multidomain acoustic wave transducer is provided in FIGS. 6-8, where FIG. 6 shows a diagram of the multidomain acoustic transducer consisting of a single piezoelectric crystal 1 in which inversely poled ferroelectric domains 2 and 3 are implanted. The widths of the domains and spacing between them are variable to ensure a wide band operation of the transducer; there is no periodicity in this inversely poled domain array. A collection of the inversely poled domains within the single piezoelectric crystal 1 will function as a multidomain acoustic transducer if an external rf voltage is applied to the piezoelectric crystal 1.

Figure 7:
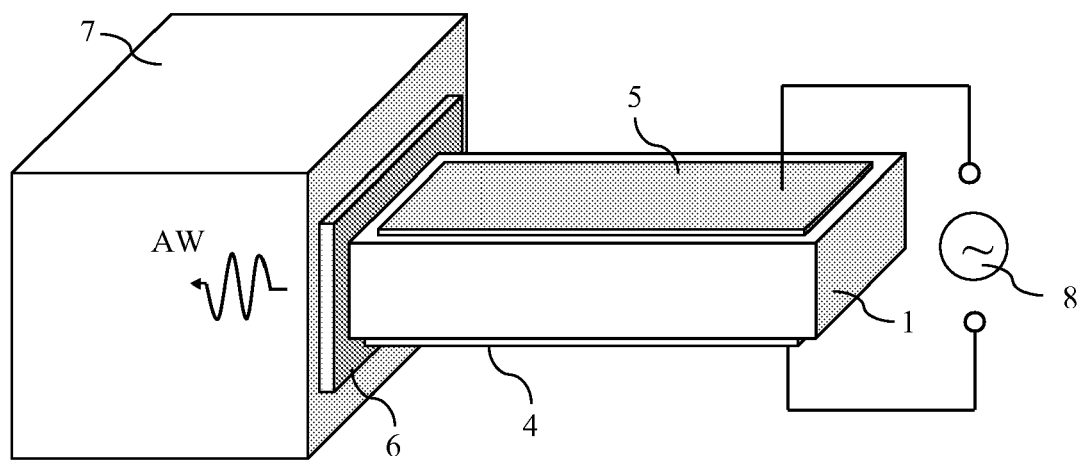
FIG. 7 is a view of multidomain acoustic transducer attached to an adjacent media incorporating the single piezoelectric crystal of FIG. 6.
Figure 8:
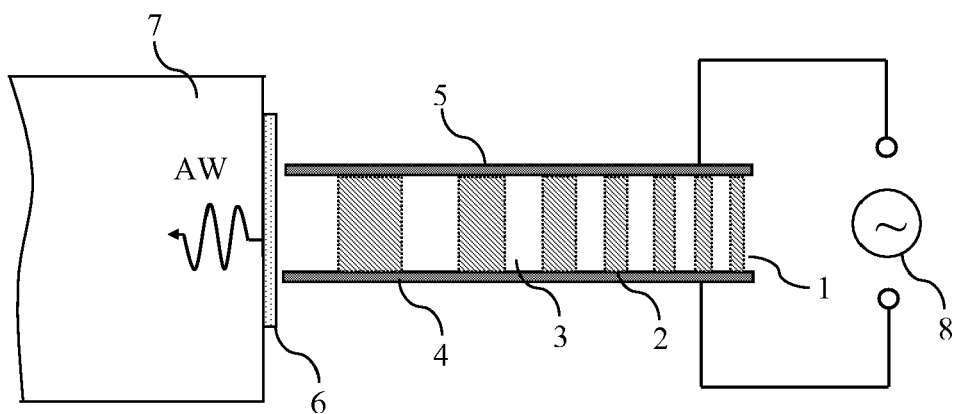
FIG. 8 is a sectional view of a multidomain acoustic transducer, in accordance with another aspect of the present invention.

FIG. 7 depicts a transducer with metal contacts 4 and 5 which incorporates the single piezoelectric crystal 1. The transducer is attached to an acoustic load 7 that can be any solid, liquid, biological object or gaseous media. The acoustic load 7 is attached to the piezoelectric crystal 1 through matching layer 6. An external rf voltage from a rf generator 8 is applied to the metal contacts 4, 5. FIG. 8 shows a sectional view of the transducer shown in FIG. 7.

Figure 9:
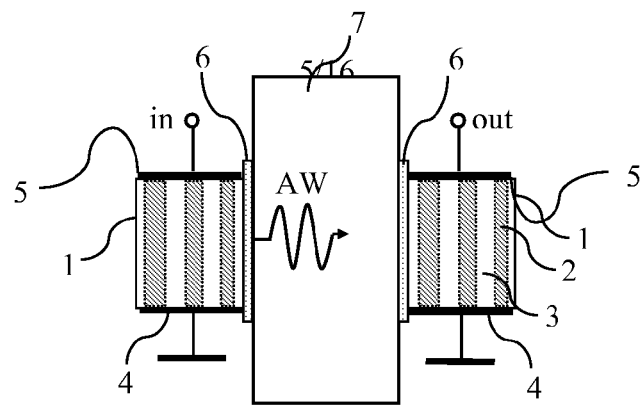
FIG. 9 is a sectional view of a wide band multidomain acoustic delay line consisting of two transducers attached to another medium, in accordance with another aspect of the present invention.
Figure 10:
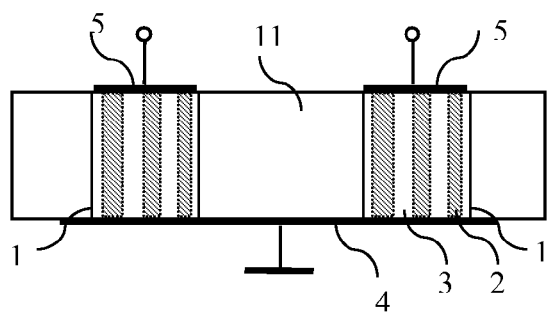
FIG. 10 is a sectional view of a wide band multidomain acoustic delay line consisting of a sole crystal, in which two wide band multidomain acoustic transducers are fabricated and implanted, in accordance with the present invention.

Two forms of a wide band multidomain plate acoustic wave delay line in accordance with the present invention are shown in FIGS. 9 and 10. FIG. 9 is a sectional view of the wide band multidomain acoustic delay line consisting of two wide band multidomain plate acoustic wave transducers made from a single piezoelectric crystal 1 with the inversely poled not periodic domains 2, 3 of different widths, and with metal electrodes 4, 5. The transducers are attached to another medium 7. To the input transducer, an in-rf-pulse is applied, and plate acoustic wave (PAW) is generated inside the input crystalline plate transducer. This PAW is then propagates inside the medium 7, and after delay time of propagation enters output transducer that yields output rf voltage. A particular feature of the delay line shown in FIG. 9 is the delay medium 7 that may be different material than the in and out transducers.

Figure 11:
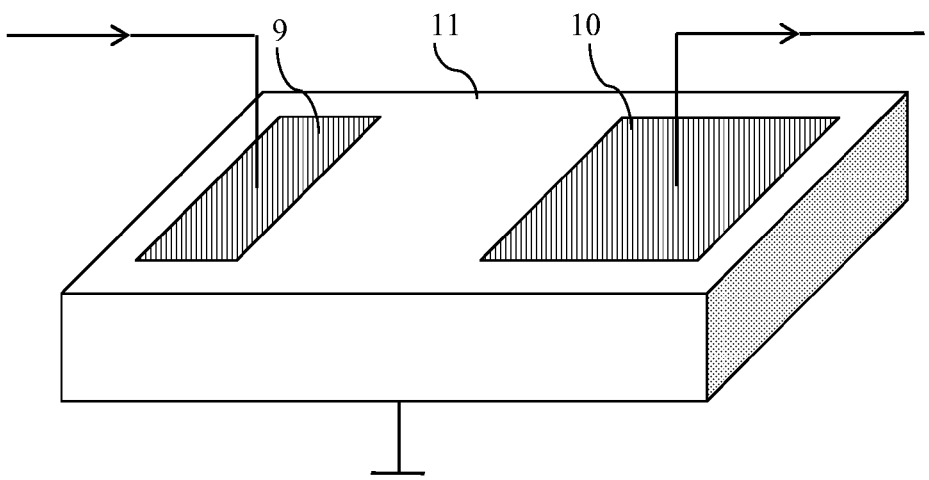
FIG. 11 is a three dimensional view of a wide band multidomain acoustic delay line consisting of a sole crystal with input and output wide band multidomain acoustic transducers, in accordance with the present invention.

FIG. 10 shows another form of the delay line, in which the medium 11 for plate acoustic wave delay is made of the same material that the PAW multidomain transducers. FIG. 10 is a sectional view of a wide band multidomain acoustic delay line consisting of a sole single crystal 11, in which two wide band multidomain acoustic transducers are fabricated and implanted. Two transducers are implanted into a crystalline plate and have a certain distance between them to ensure a needed delay time. FIG. 11 is a view of the delay line of FIG. 10; the input transducer 9 generates PAW that propagates along the plate 11 and enters output transducer 10.

Figure 12:
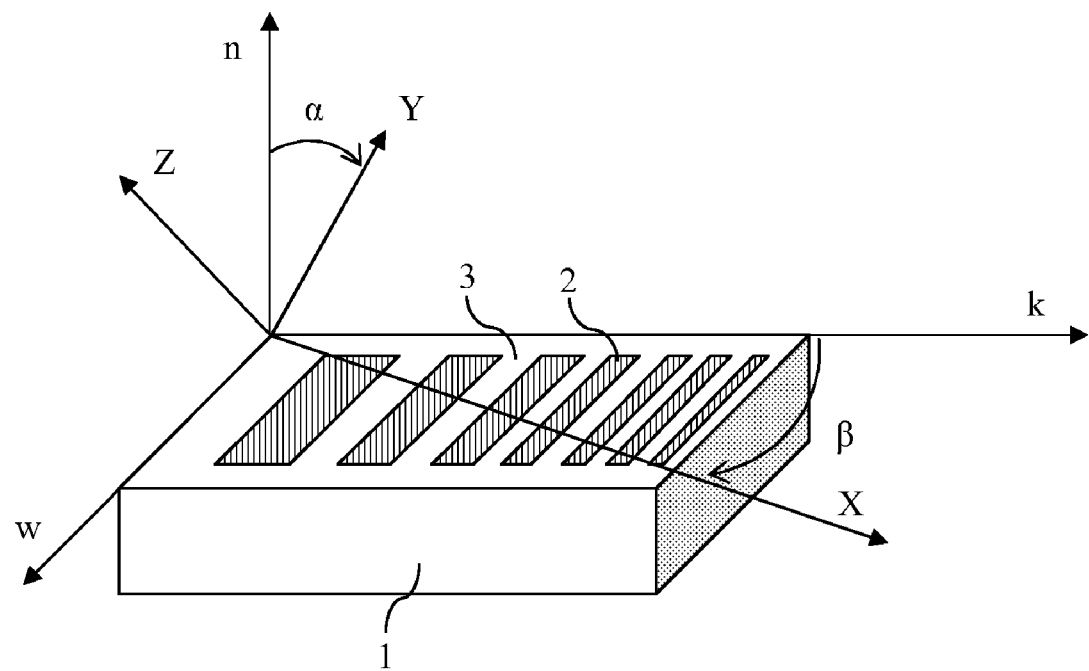
FIG. 12 is a diagram showing a single piezoelectric crystal with arbitrary orientation of the crystallographic axes X, Y, Z with respect to crystal surface, in which a set of inversely poled ferroelectric domains is implanted.

FIG. 12 depicts a single piezoelectric crystal plate 1 of an oblique cut with the rotated crystallographic axes. An arbitrary orientation of the crystallographic axes X, Y, Z with respect to crystal surface is given by the angles of rotation α and β. Laboratory reference frame k, n, w is connected to the piezoelectric crystal 1 edges. Usually the angles α and β are chosen to increase an electromechanical coupling coefficient that represents an efficiency of a transformation of electromagnetic energy into acoustic wave and vise versa. To fabricate the transducer, the inversely poled ferroelectric domains 2 and 3 are fabricated and implanted into piezoelectric crystal 1, which can be a crystalline plate/chip. Various methods to fabricate the inversely poled domains may be used, including, but not limited to, those taught by U.S. No. Pat. 5,756,263, herein incorporated by reference.

Figure 13:
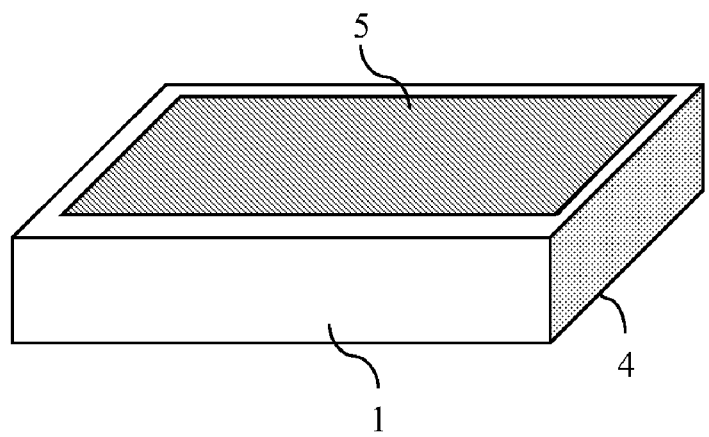
FIG. 13 is a diagram showing a multidomain acoustic transducer fabricated into a sole crystal along with metal electrodes to apply an external rf electric field in the direction normal to a basal plane of a crystal, in accordance with the present invention.
Figure 14:
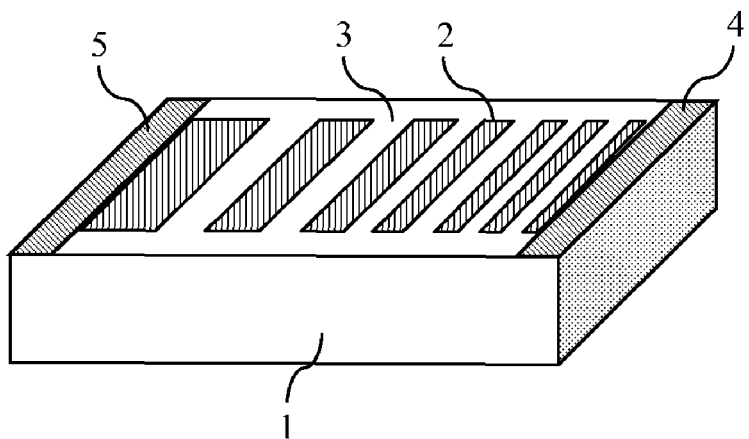
FIG. 14 is a diagram showing a multidomain acoustic transducer fabricated into a sole crystal along with metal electrodes to apply an external rf electric field in the direction parallel to k axis (length of the multidomain transducer) shown in FIG. 12.
Figure 15:
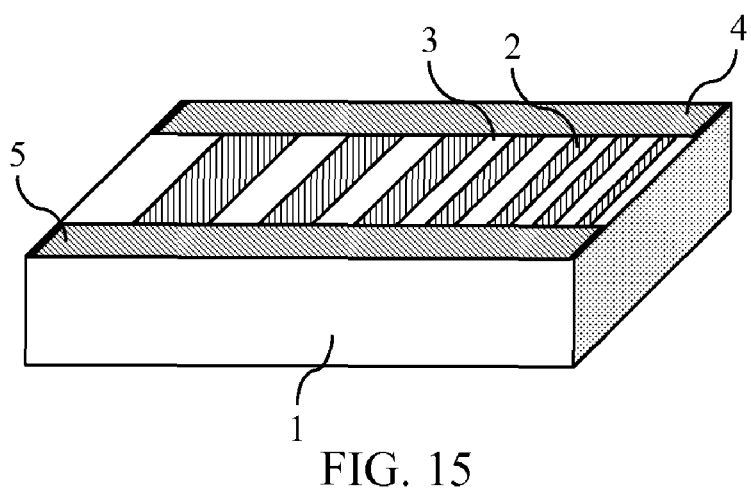
FIG. 15 is a diagram showing a multidomain acoustic transducer fabricated into a sole crystal along with metal electrodes to apply an external rf electric field in the direction parallel to w axis (width of the multidomain transducer) shown in FIG. 12.

FIGS. 13, 14 and 15 depict three main embodiments for the metal electrodes 4, 5. An important feature of the present invention is a possibility to apply external rf voltage with the help of respectively large metal electrodes 4 and 5 that can be deposited onto different surfaces of a crystalline plate, as shown in FIGS. 13, 14 and 15. The electrodes 4, 5 have the linear dimensions comparable or higher than a whole set of the inversely poled ferroelectric domains, and electrode dimensions are much bigger than a width of a single ferroelectric domain 2 or 3. This is distinguishable from prior devices such as those of U.S. Pat. No. 4,464,639, in which an interdigital transducer for Surface Acoustic Wave excitation must have the metal electrodes more thinly than an acoustic half-wavelength.

Figure 16:
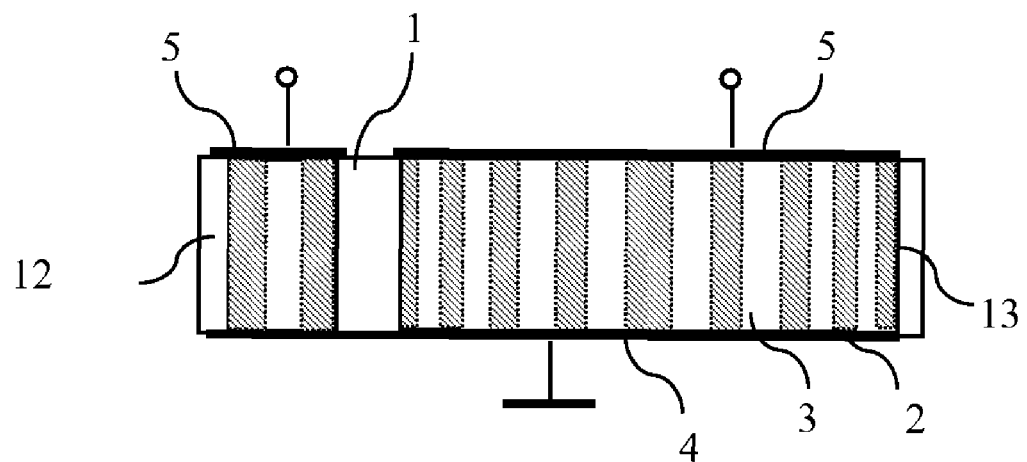
FIG. 16 is a cross sectional diagram of a multidomain rf filter in accordance with the present invention.
Figure 17:
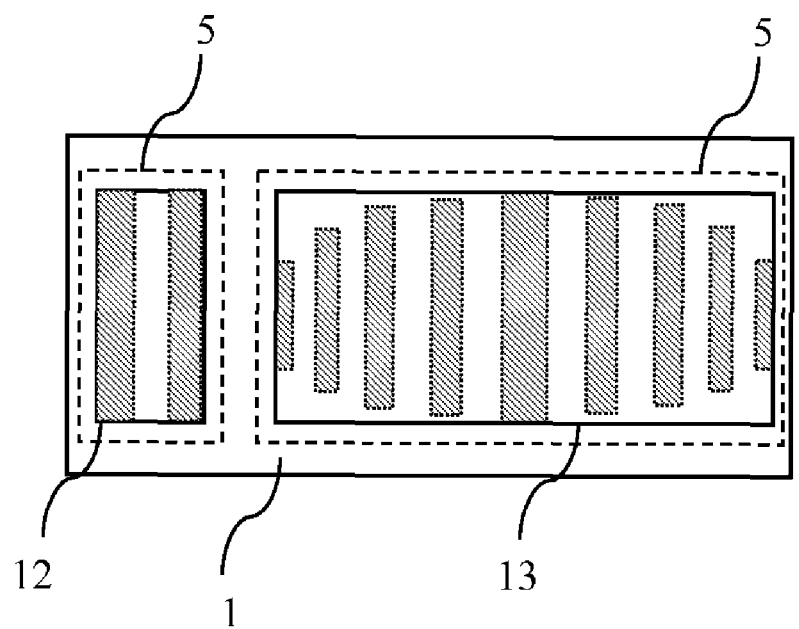
FIG. 17 is a plan view schematic diagram of a multidomain rf filter in accordance with the present invention.
Figure 18:
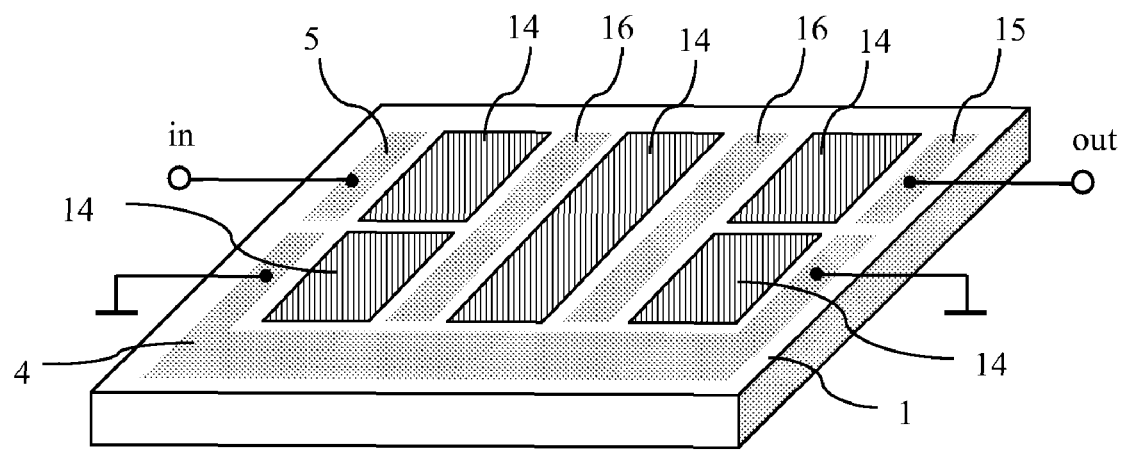
FIG. 18 is a multidomain rf filter based on multiple plate acoustic wave transducers, in accordance with the present invention.

Two multidomain rf filters are depicted in FIGS. 16, 17 and 18. FIG. 16 is a cross sectional diagram of a multidomain rf filter. Input transducer 12 and output transducer 13 have different numbers of the inversely poled domains 2, 3. Input transducer 12 is designed as a wide band one and output transducer 13 has narrower band of operation. A band pass frequencies of the filter depend on the dimensions and number of the domains 2 and 3. As depicted in FIG. 17, the width and length of the domains in output transducer 13 are variable that is transducer 13 has an apodization of its inversely poled domains.

Figure 19:
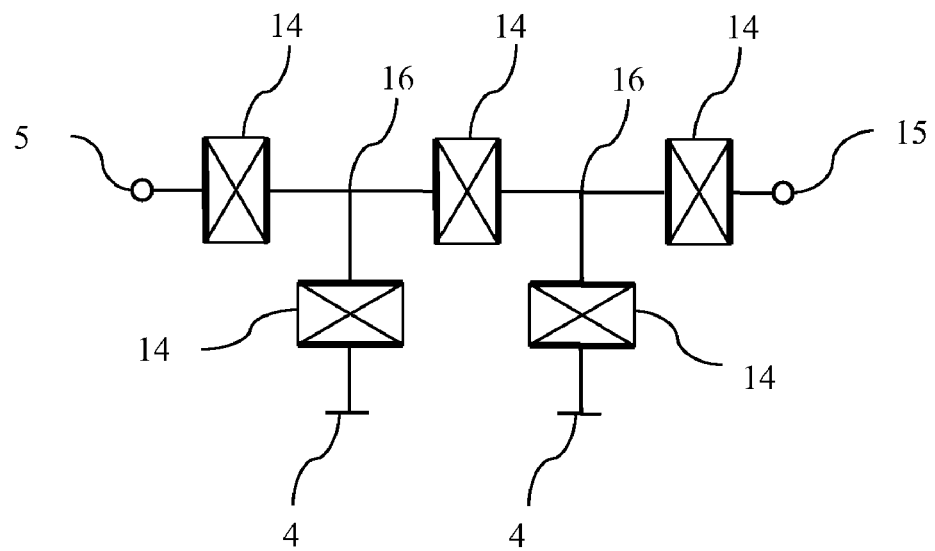
FIG. 19 is an equivalent circuit of the rf filter of FIG. 18.

FIG. 18 depicts an integrated multidomain rf filter consisting of more than one multidomain plate acoustic wave transducers 14 embedded into a sole single crystal 1 along with the metal connecting electrodes 16 and grounded electrode 4. Input rf voltage is applied to electrode 5, and filtered output rf voltage reads from output electrode 15. An equivalent circuit of this rf filter is shown in FIG. 19. One can design any frequency characteristic of this rf filter by using the transducers 14 with different number of the inversely poled domains and variable dimensions of the single domains including altering of their width and length.

EXAMPLES

In order to provide a more thorough understanding of the present invention, reference is made to the following non-limiting examples.

To verify feasibility and performance of the multidomain plate acoustic wave devices, in the examples that follow, the devices were cut out of the crystalline chips of LiTaO$_3$ available on the market place. The inverted ferroelectric domains with inverse polarization were fabricated by applying constant voltage to certain regions of the device under study. Polarization inversion was achieved under voltage of the order of 21 Kilovolts/mm that was supplied from high voltage generator. Equipment used in the examples comprised function generator Agilent 33250A, spectrum analyzer Advantest R3131A, digital oscilloscopes LeCroy 9400 and HP54601A, two-dimensional XY-stage Velmex with (1/16000) inch resolution, high voltage supply Glassman 30 kV, computers, optical polarizing microscope and optical binocular microscope, ccd camera, some small components and chemicals.

Multidomain structures were fabricated in a single crystal lithium tantalite chips as described by Ostrovskii 2005 (1). Thicknesses of the wafers were 350 microns for rotated-cut-wafers and 500 microns for Z-cut-plates. Inversion in polarization is observed when applied voltage is about 21 kV/mm along Z-axis of a crystal. To reveal the inversely poled domains, a chemical etching (boiling mixture of 2 parts of 70% HNO$_3$ and 1 part of 50% HF) was applied to the samples. Subsequent optical observations through polarizing microscope confirmed the existence of the inversely poled domain arrays in the samples under study. In further experiments, it was observed that the resonance properties of the fabricated multidomain arrays, and their applications in typical plate acoustic wave devices.

Example 1

A Wide Band Multidomain Plate Acoustic Wave Delay Line

Figure 20:
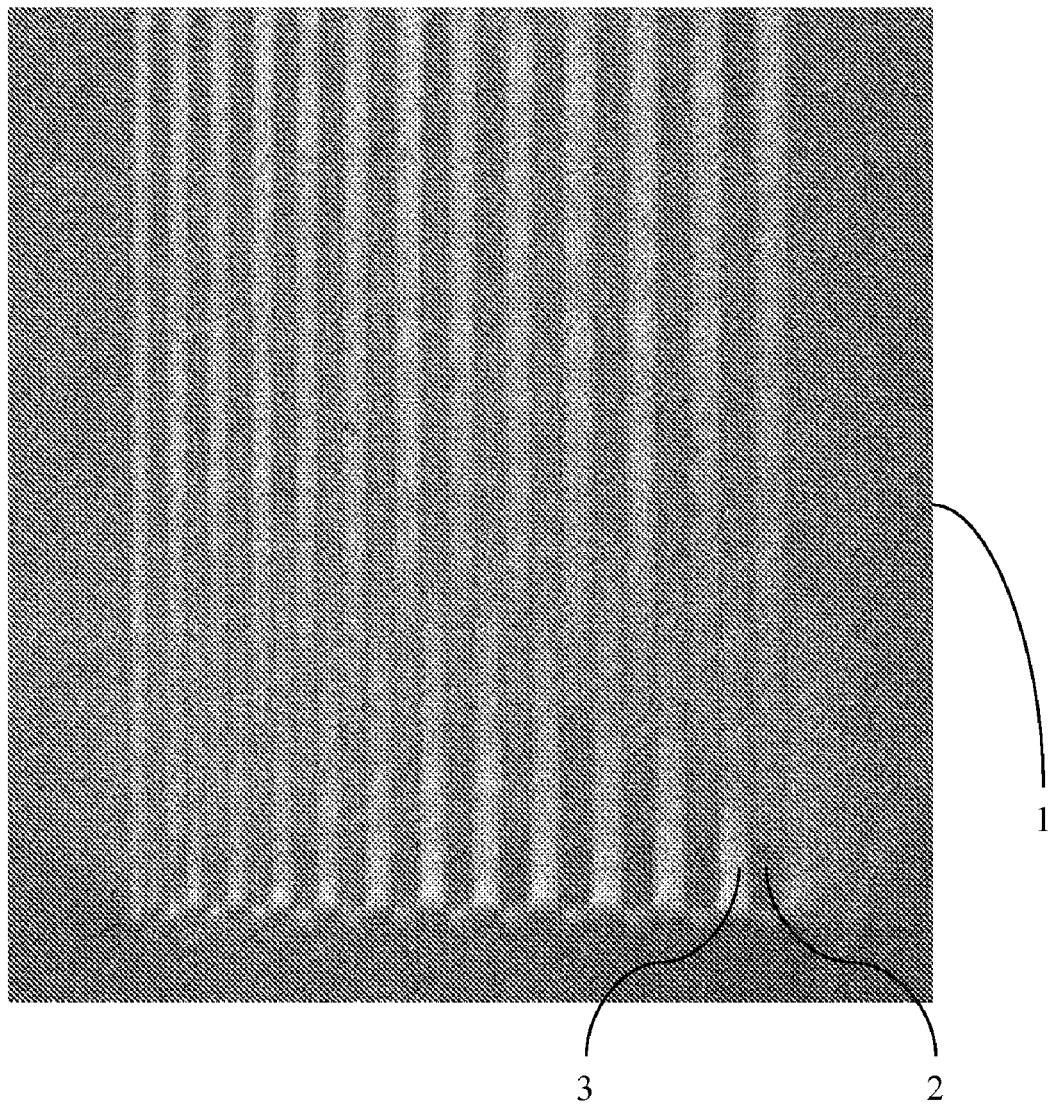
FIG. 20 is a microphotograph of a wide band transducer fabricated in 500 μm thick $LiTaO_3$ chip, in accordance with the present invention.
Figure 21:
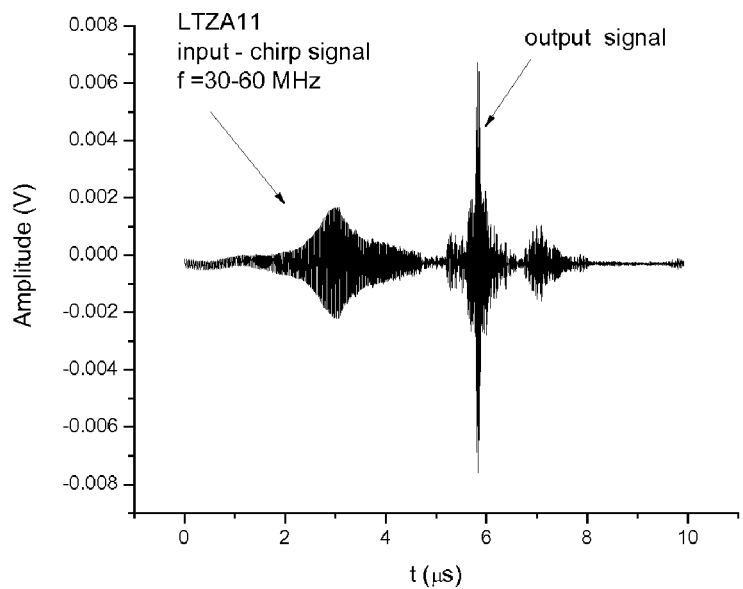
FIG. 21 is the oscillogram taken from the wide band plate acoustic wave delay line LTZA11.
Figure 22:
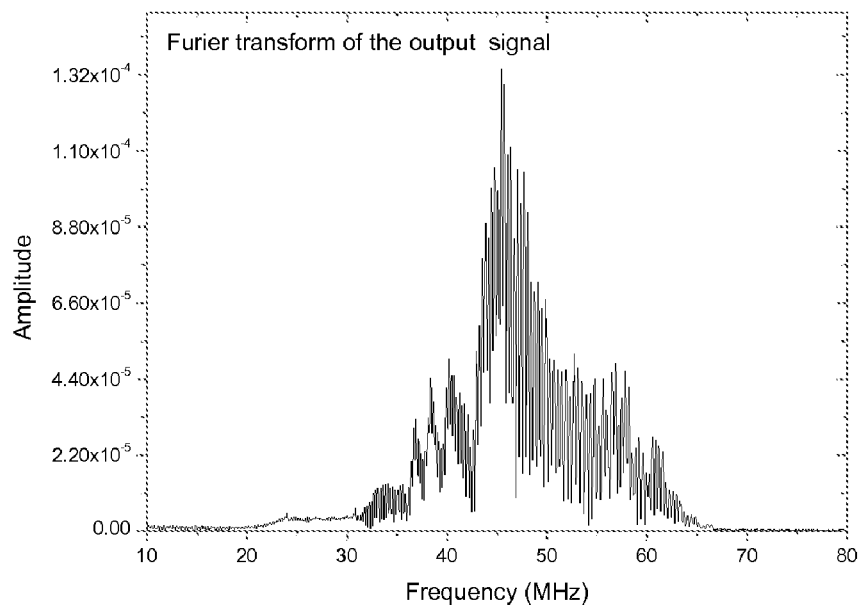
FIG. 22 is a Fourier transform of the output signal from the wide band plate delay line LTZA11.

A wide band multidomain plate acoustic wave delay line was fabricated in a chip of a single crystal LiTaO$_3$. The sample delay line LTZA11 was fabricated in a sole piece of 500-micron thick crystalline plate as shown in FIGS. 10 and 11. Input transducer 9 of 1 mm total length had 28 inversely poled domains with a variable width from 25 microns to 50 microns, and output transducer 10 of 10 mm total length had 268 inversely poled domains with variable width from 25 microns to 50 microns. The transducers were fabricated as shown in FIGS. 6 and 7. FIG. 20 is a microphotograph of a fragment of this transducer. The gray colors are obtained when a micrograph is taken through polarizing microscope; the introduced domains with polarization inversion look whiter. The introduced inversely poled domains have clearly variable widths and spacing. Distance between the transducers was 3 mm. A wide band rf chirp signal was applied to input transducer 9, and output transducer 10 read a delayed narrow signal. FIG. 21 presents the oscillogram of input wide signal and narrow output signal delayed for about 6 microsecond. Fourier transform of the output signal is shown in FIG. 22, which proofs this delay line is the wide band plate acoustic wave device operating in the overall frequency range of 32 to 64 MHz.

Example 2

60 MHz Multidomain Plate Transducer

Figure 23:
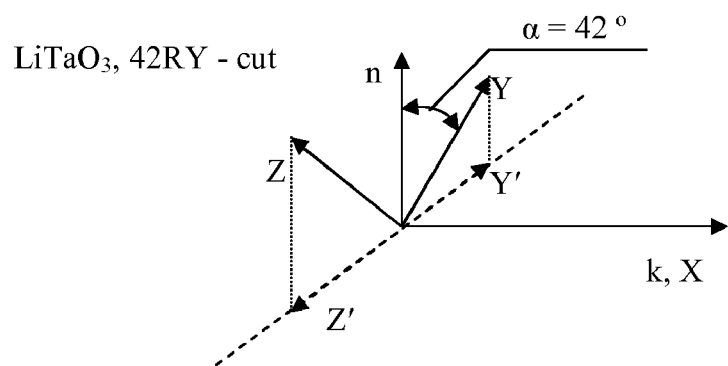
FIG. 23a is a fragment of multidomain plate acoustic wave transducer fabricated in $LiTaO_3$ single crystal plate.
FIG. 23b is a plot showing projections Y' and Z' of the crystallographic axes Y and Z, respectively, on a crystal surface.
FIG. 23c is a plot showing rotated crystallographic axes Y and Z, where axis Y is rotated at angle α with respect to the vector normal n.
Figure 23:
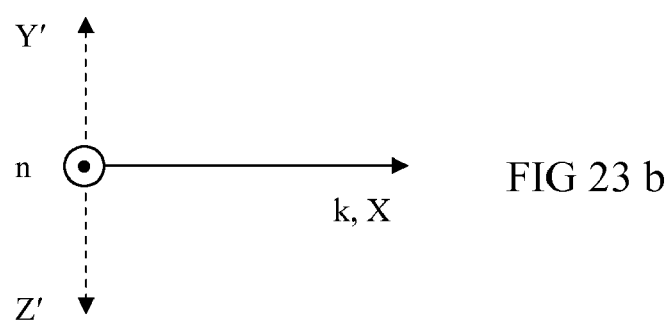
Figure 23:
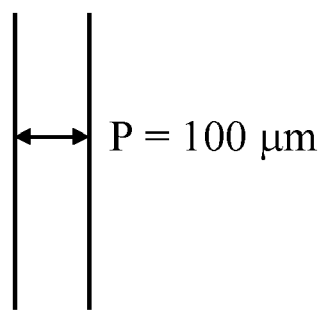
Figure 23:
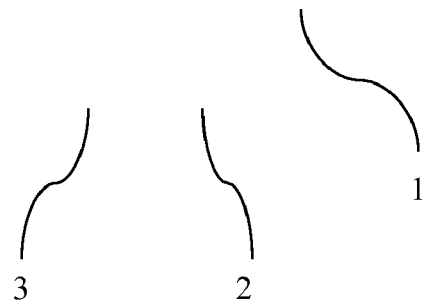

An important acoustoelectric characteristic is the rf-admittance of the vibrating multidomain structure, since it shows whether the vibrator can be used for rf filtering, and in what frequency range. A fragment of the inversely poled multidomain array in the sample LTYR42B5a is shown in FIG. 23. Crystallographic axes of this 350-micron thick sample are rotated as shown in FIGS. 12 and 23, the angle $\alpha=42°$ and angle $\beta=0°$. Two gray colors are obtained when a micrograph is taken through polarizing microscope. Different gray colors correspond to inversely polarized domains; the edges are even, and the engineered domains are of good quality. In this transducer, the total number of the domains is 80 that corresponds to number of inversely poled pairs N=40.

Figure 24:
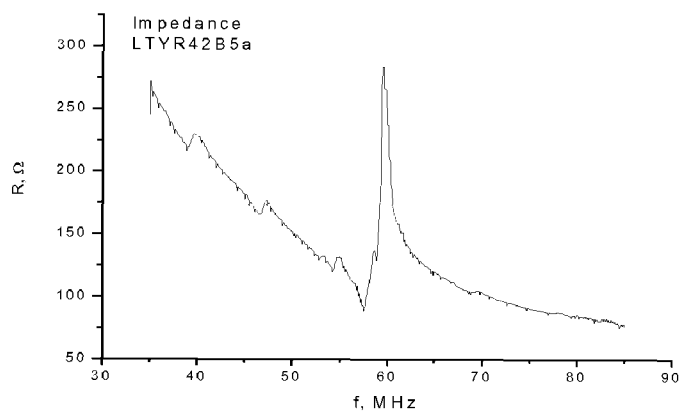

FIG. 24 shows the rf impedance of this transducer as a function of frequency. A good "resonance-anti resonance" dependency is detected near 60 MHz. The transducer was acoustically loaded. The resonance observed is a pure "multidomain resonance." It means that a set of inversely poled domains posses its own vibration resonance despite a crystal length, which is much longer than any dimension of a single domain. The resonance frequency becomes higher when the domain width is smaller.

Example 3

Multidomain Plate Acoustic Wave Delay Line

Figure 25:
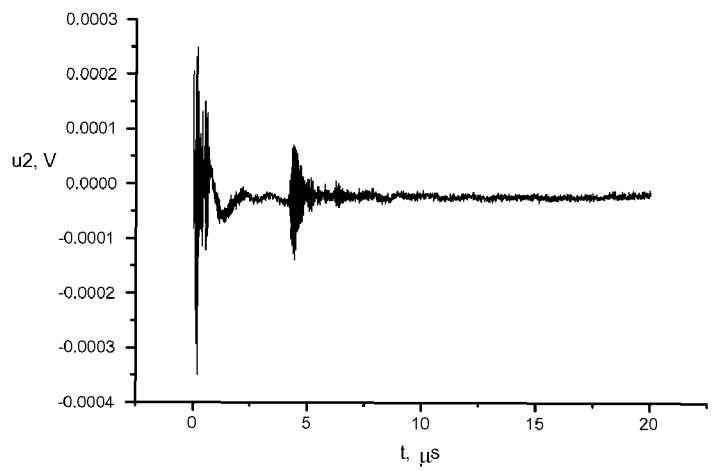
FIG. 25a is an oscillogram of 60 MHz ultrasound burst delayed in water delay line.
FIG. 25b is a schematic of a model delay line with water as a medium, corresponding to the device of FIG. 9.
Figure 25:
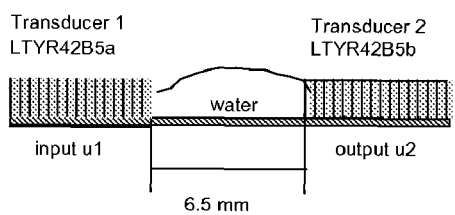

Two transducers from Example 2 were used to model a delay line with water as a medium of propagation for 60 MHz ultrasound burst. Experimental arrangement sketched in FIG. 25b corresponds to the device depicted in FIG. 9. In FIG. 25a, an oscillogram shows an output burst delayed for 5 microseconds in the water. Input signal is at t=0 (its amplitude is not to scale), and output burst is delayed.

Example 4

A 0.56 GHz High Frequency Wide Band Multidomain Plate Transducer

Figure 26:
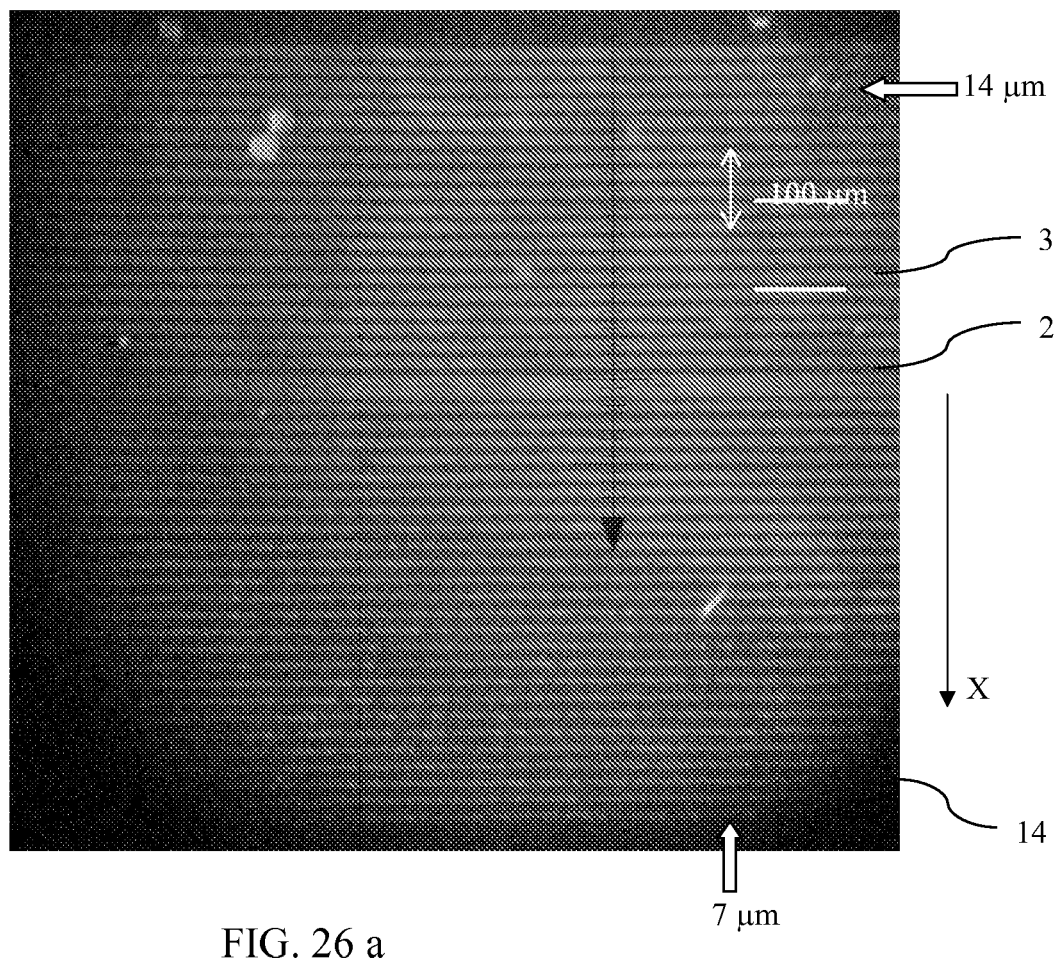
Figure 26:
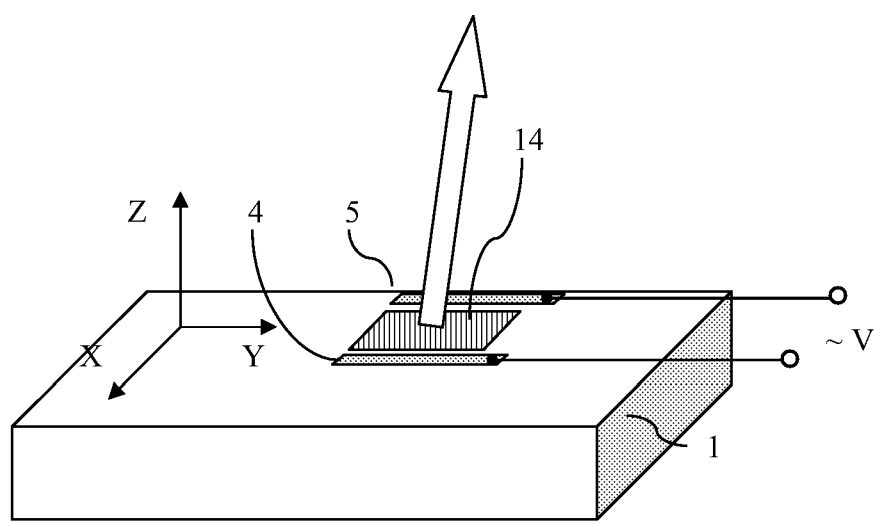

To show dependency of the domain resonance frequency on domain width and transducer ability to operate at third harmonic, the multidomain structure with variable domain width from 7 to 14 microns was fabricated. It is shown in the microphotograph of this transducer presented in FIG. 26; sample LTZ-A9-P22. Inversely poled domains appeared to have different gray scale color when observed through optical polarizing microscope. The embodiment of this transducer is depicted in FIGS. 26b and 14, where a dashed area corresponds to the multidomain array pictured.

Figure 27:
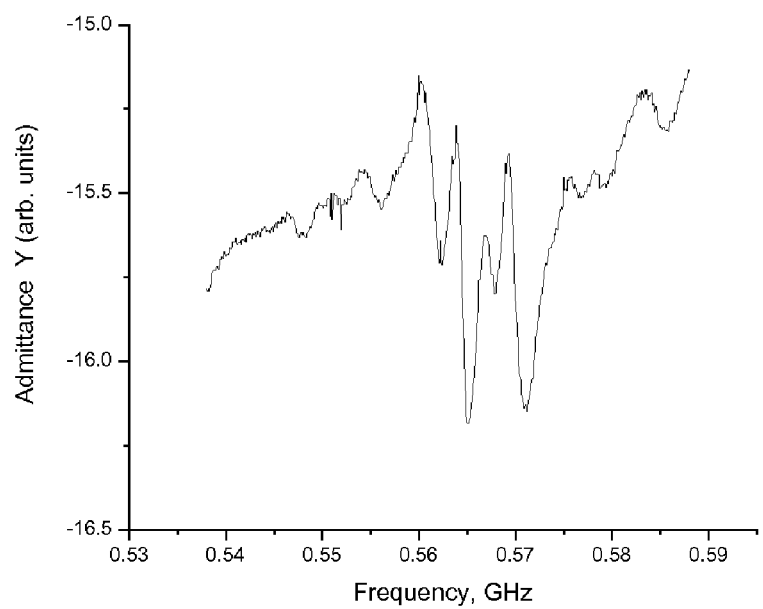
FIG. 27 is a plot of rf admittance versus frequency taken from the sample LTZ-A9-P22.

FIG. 27 presents rf admittance versus frequency taken from the sample LTZ-A9-P22 at third harmonic. It is clearly observed a set of resonance picks in the range 0.56 GHz to 0.59 GHz. Without committing to a single theory, the extremes in FIG. 27 appear presumably due to acousto-electric properties of the multidomain plate acoustic wave transducer with active micro-domain structure designed for very high frequency operation.

Example 5

Multidomain rf Filter

Figure 28:
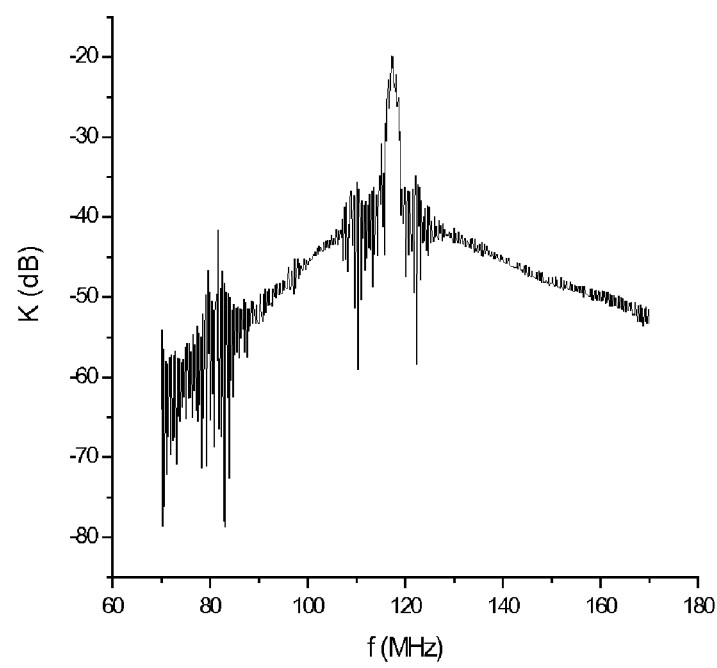
FIG. 28 is a plot of output-to-input voltage ratio taken from the multidomain rf filter; sample LTYR42B4.

A multidomain rf filter was fabricated having a filter consisting of two multidomain plate acoustic wave transducers in accordance with the device of FIG. 16. The filter was fabricated in a rotated Y-cut chip of ferroelectric single crystal LiTaO$_3$; sample LTYR42B4. Crystallographic axes are shown in FIG. 12, where the angle $\alpha=42°$ and angle $\beta=0°$. The input and output transducers had length of 2 mm, and the width of a single domain was 23 microns. An rf signal of constant/flat amplitude in a wide frequency range of 70 MHz to 170 MHz was applied to input transducer, and output signal was detected from output transducer. The output rf voltage was further analyzed, and a frequency dependency of the ratio K of output-to-input voltage is presented in FIG. 28. A transmission function K(f) has a clear sharp peak near 120 MHz, and so demonstrates a property of rf filter.

Example 6

Chirp Plate Acoustic Wave Transducer

Figure 5:
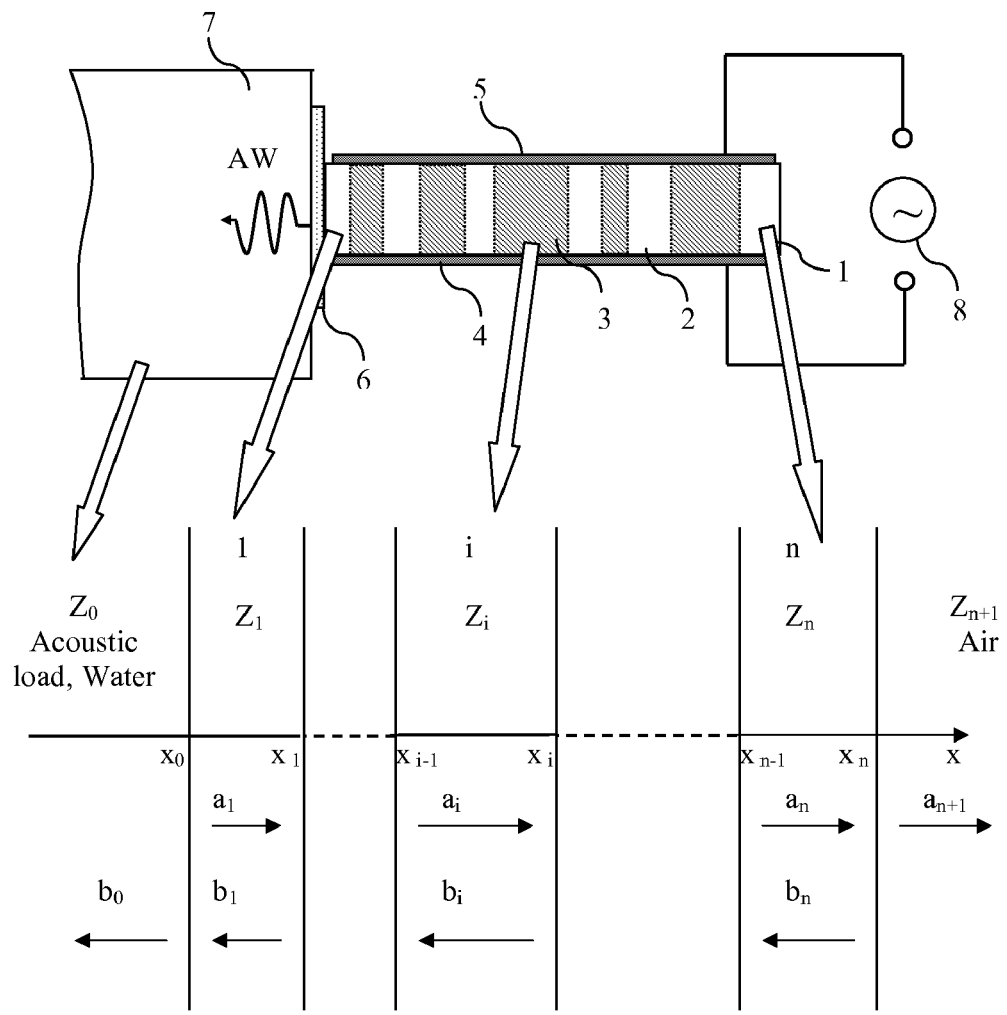
FIG. 5 is a model of a multidomain acoustic transducer with an acoustic load.
Figure 29:
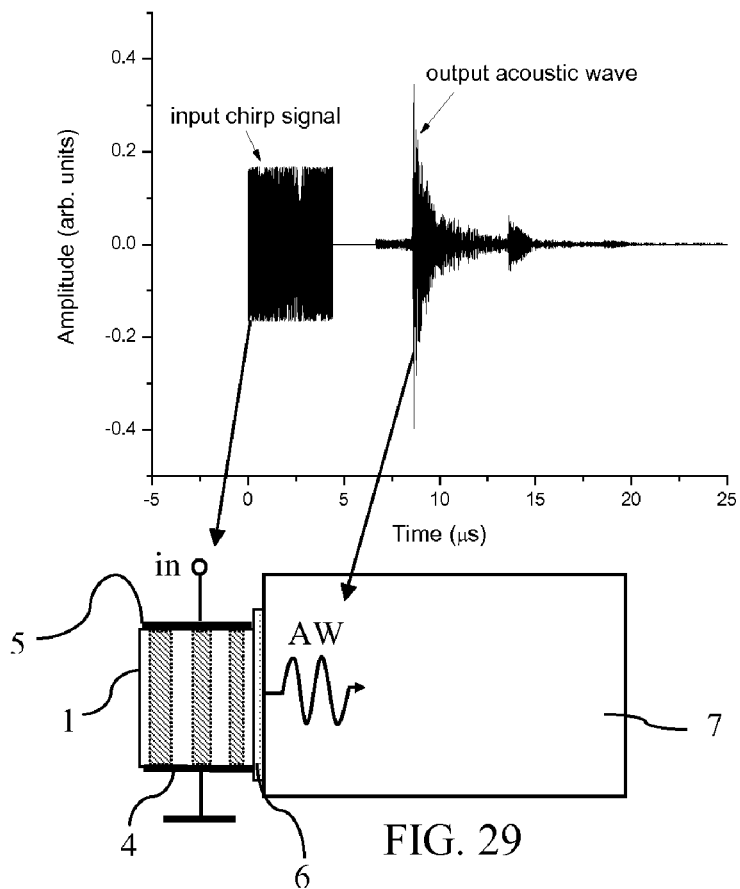
FIG. 29 is a plot of computer simulations of the wide band plate acoustic wave transducer described in Example 6.
Figure 30:
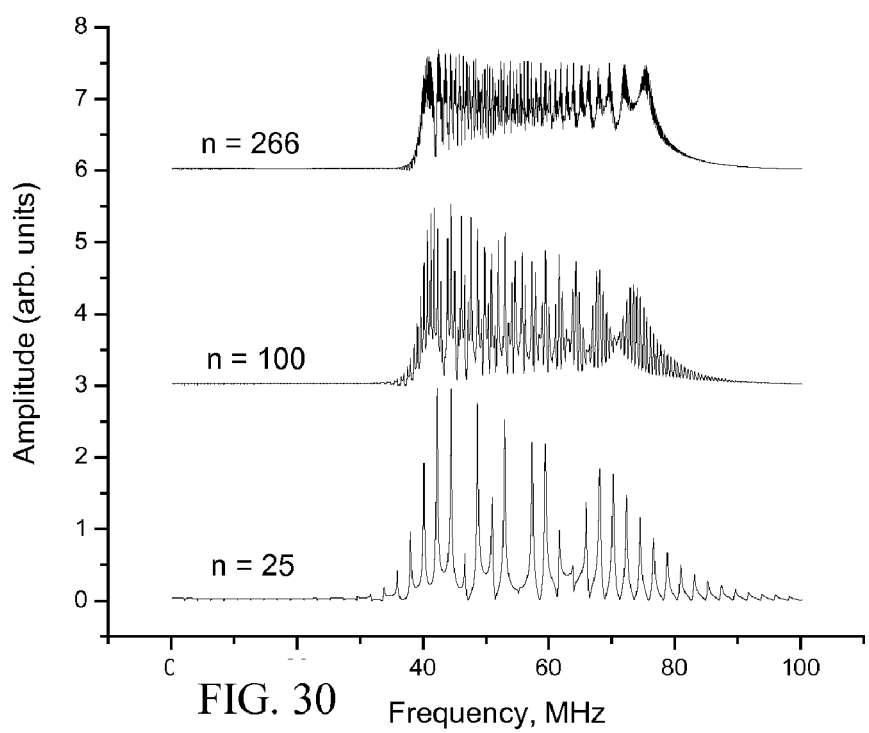
FIG. 30 is a computed plot of amplitude v. frequency for the wide band plate acoustic wave transducer consisting of different number (n) of inversely poled domains as described in Example 6.

In this example, the results of computer simulations of the wide band plate acoustic wave transducer are provided. The lithium tantalite transducer is excited by applying an input chirp rf voltage to the electrode 5, as shown in FIG. 29. Further, inside transducer the chirp rf current is converted into a chirp acoustic wave that is directed into adjacent water medium 7 through matching layer 6, using the corresponding model of FIG. 5. In the computations by Finite Element Method, the total number of ferroelectric domains n was varying from 25 to 266. To assure a wide band operation, the domain widths within multidomain array were varying from 25 to 50 microns. Theoretically obtained time envelope of electrical energy transformation into ultrasound is shown on the top of FIG. 29. It is in agreement with the experimental results presented in FIG. 21. Acoustic amplitude versus frequency is shown in FIG. 30 for three different total numbers n of the domains. As number n increases, more frequencies in the acoustic signal is present. A spectrum of the input chirp signal was 40 to 80 MHz, and consequently the acoustic wave excited is in the range of 40 to 80 MHz. The theoretical results are in agreement with the experimental measurements in the range 32 to 64 MHz from the sample LTZA11 presented in FIGS. 21 and 22.

It will now be understood by one of ordinary skill in the art that the present invention offers advantages and features over prior devices. For example, the present invention provides for a completely new property in a multidomain transducer in the form of its ability to generate different type of the acoustic waves, for example longitudinal and transversal at different fundamental frequencies.

Figure 1:
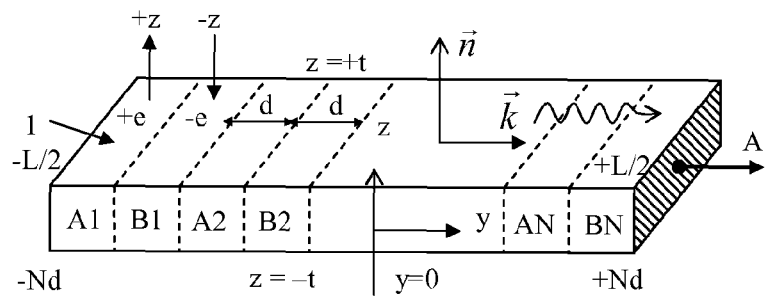
FIG. 1 is a view of a prior art, free periodically poled ferroelectric vibrator.
Figure 2:
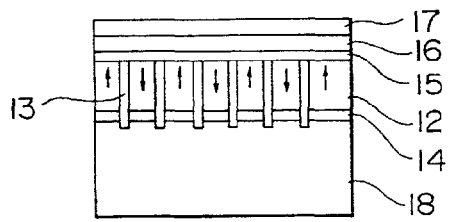
FIGS. 2a and 2b are sectional views of two prior art intersecting ultrasonic transducer arrays.
Figure 2:
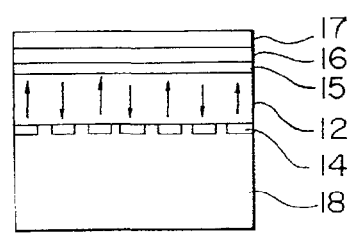
Figure 3:
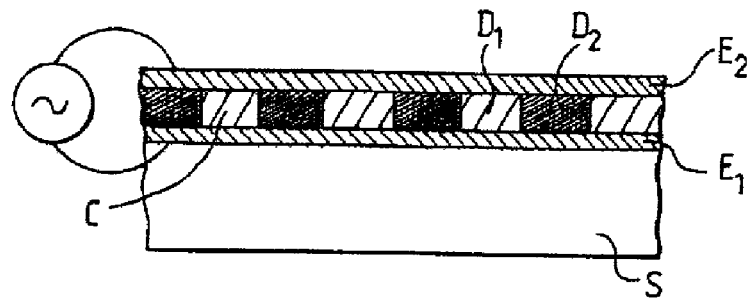
FIG. 3 is a sectional view of another prior art device.
Figure 4:
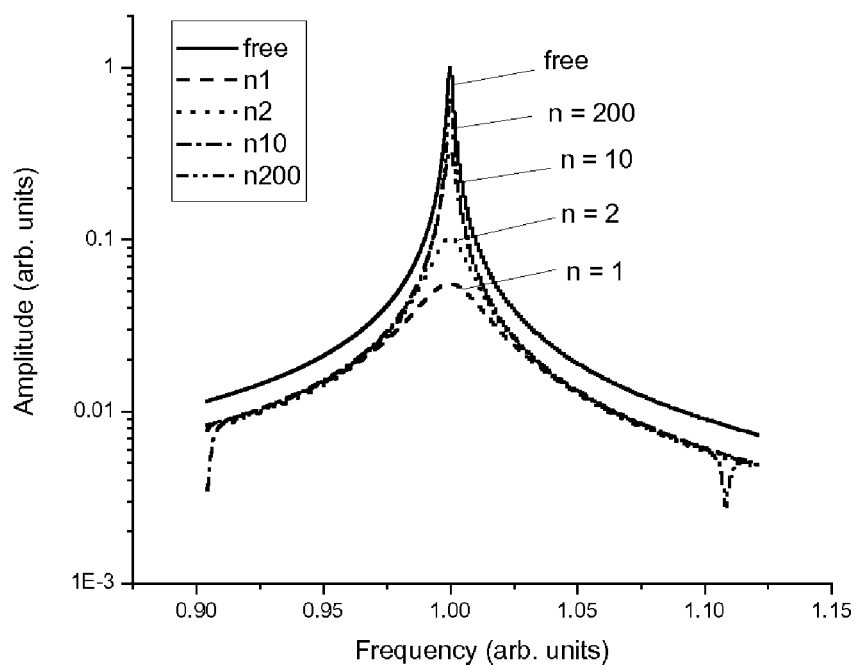
FIG. 4 is a plot depicting a theoretical dependency of acoustic wave amplitude versus frequency for the multidomain acoustic transducers with different number n of inversely poled domains.

Further it should now be clear to one of ordinary skill in the art that the present invention is distinct from prior devices in that the present devices only require two electric contacts that supply electric voltage to the completely multidomain array. This is in contrast with the prior art device of FIG. 2, where many electrical contacts or separated domains are needed for ultrasonic composite transducer to operate.

Throughout this disclosure, various publications, U.S. Patents and U.S. Patent Application Publications are referenced. All references cited herein are expressly incorporated by reference in their entirety and are considered part of this disclosure.

The invention claimed is:

1. A multidomain plate acoustic wave device, said device comprising:
   one or more single plate acoustic wave propagating piezoelectric plates with differently polarized ferroelectric domains, said domains having diverse directions of their axes of polarization.

2. The device of claim 1, wherein said device is selected from the group consisting of a multidomain plate acoustic wave transducer, a multidomain plate acoustic wave delay line, a multidomain plate acoustic wave rf filter, and any combination thereof.

3. The device of claim 1, wherein said differently polarized ferroelectric domains comprise a collection of inversely or differently poled ferroelectric domains within a single piezoelectric medium, said medium selected from the group consisting of any crystalline or ceramic plate with non-zero piezoelectric properties, in which said domains are created and embedded.

4. The device of claim 1, wherein said ferroelectric polarized domains have different dimensions and spacing between them.

5. The device of claim 1, wherein said ferroelectric domains are formed in an oblique crystallographic cut chips.

6. The device of claim 4, wherein said ferroelectric domains are formed in an oblique crystallographic cut chips.

7. The device of claim 1, wherein said ferroelectric domains having variable dimensions.

8. The device of claim 1, wherein a plate acoustic wave is propagated within the piezoelectric plate when an external electric field is applied to the device.

9. The device of claim 2, wherein a plate acoustic wave is propagated within the body of the piezoelectric plate when an external electric field is applied to the device.

10. The device of claim 1, wherein one or more of ferroelectric domain dimensions, inter-domain distances between neighbor domains, and directions of domain polarizations are variable or changing from one ferroelectric domain to another.

11. The device of claim 1, wherein said device can generate a plate acoustic wave in a band of kilohertz, megahertz, gigahertz, and terahertz frequency range.

12. The device of claim 1, wherein said device can generate a plate acoustic wave that is a plate acoustic wave of ultra high frequencies, a chirp acoustic wave, an ultrasound of variable frequencies or in accordance to desirable rate of frequency change with time.

13. The device of claim 1, wherein said multidomain device is fabricated in a piezoelectric media having dimensions in centimeter-millimeter, micro-, and nano- scale range of overall transducer dimension.

14. The device of claim 1, wherein one or more multidomain plates form a multidomain plate acoustic wave delay line or a rf filter.

15. The device of claim 1, further comprising electrodes oriented so as to apply an external rf electric field in a direction normal to a basal plane of the one or more single piezoelectric plates comprising the device.

16. The device of claim 1, further comprising electrodes oriented so as to apply an external rf electric field in a direction parallel to a length of said device defined by the one or more single piezoelectric plates comprising the device.

17. The device of claim 1, further comprising electrodes oriented so as to apply an external rf electric field in a direction parallel to a width of said device defined by the one or more single piezoelectric plates comprising the device.

18. The device of claim 1, wherein the piezoelectric plates comprise piezoelectric crystalline plates.

* * * * *